(12) United States Patent
Lester et al.

(10) Patent No.: US 7,633,083 B2
(45) Date of Patent: Dec. 15, 2009

(54) METAMORPHIC BUFFER ON SMALL LATTICE CONSTANT SUBSTRATES

(75) Inventors: Luke F. Lester, Albuquerque, NM (US); Larry R. Dawson, Albuquerque, NM (US); Edwin A. Pease, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 93 days.

(21) Appl. No.: 11/078,642

(22) Filed: Mar. 10, 2005

(65) Prior Publication Data

US 2006/0017063 A1 Jan. 26, 2006

Related U.S. Application Data

(60) Provisional application No. 60/551,747, filed on Mar. 10, 2004.

(51) Int. Cl.
*H01L 29/06* (2006.01)
(52) U.S. Cl. .......................... 257/20; 257/15; 257/191; 257/192; 257/E29.089; 257/E29.072
(58) Field of Classification Search .................. 257/20, 257/15, E29.072, E29.089
See application file for complete search history.

(56) References Cited

U.S. PATENT DOCUMENTS

| 5,385,864 | A | * | 1/1995 | Kawasaki et al. ............. 438/48 |
| 5,430,310 | A | * | 7/1995 | Shibasaki et al. ........... 257/190 |
| 5,594,750 | A | * | 1/1997 | Zhang et al. ............ 372/45.012 |
| 5,770,868 | A | * | 6/1998 | Gill et al. ..................... 257/190 |
| 5,798,540 | A | * | 8/1998 | Boos et al. ................... 257/194 |
| 6,888,179 | B2 | * | 5/2005 | Uppal ......................... 257/190 |

OTHER PUBLICATIONS

Pease, E. A., et al., "2.5-3.5 μm optically pumped GaInSb/AlGaInSb multiple quantum well lasers grown on AlInSb metamorphic buffer layers," Journal of Applied Physics, vol. 93, No. 6, Mar. 15, 2003, pp. 3177-3181.
Pease, E. A. et al., "Mid-IR Lasers on AlInSb Metamorphic Buffers," Presentation at 2002 Electronics Materials Conference, 2002, 15 Pages.
Pease, E. A., "Mid-Infrared GaInSb/AlGaInSb MQW lasers on AlInSb metamorphic buffer layers," Thesis, University of New Mexico, May 2003, 107 Pages.
Pease, E. A., "Optically Pumped AlGaInSb/GaInSb Multiple Quantum Well Lasers," Proceedings, 2002 Electronics Materials Conference, Abstract D4, 2002, p. 7.

* cited by examiner

*Primary Examiner*—Kenneth A Parker
*Assistant Examiner*—Jose R Diaz
(74) *Attorney, Agent, or Firm*—MH2 Technology Law Group LLP

(57) ABSTRACT

A semiconductor device is supported by a substrate with a smaller lattice constant. A metamorphic buffer provides a transition from the smaller lattice constant of the substrate to the larger lattice constant of the semiconductor device. In one application, the semiconductor device has a lattice constant of between approximately 6.1 and 6.35 angstroms, metamorphic buffer layers include Sb (e.g., AlInSb buffer layers), and the substrate has a smaller lattice constant (e.g., Si, InP or GaAs substrates).

23 Claims, 6 Drawing Sheets

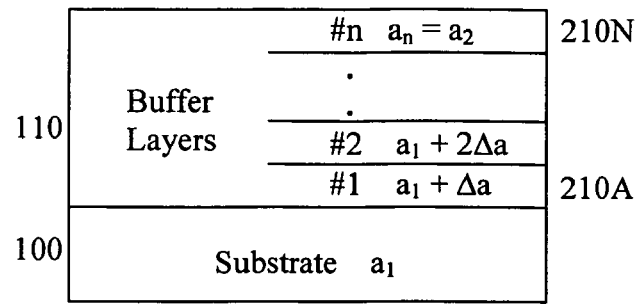
FIG. 2
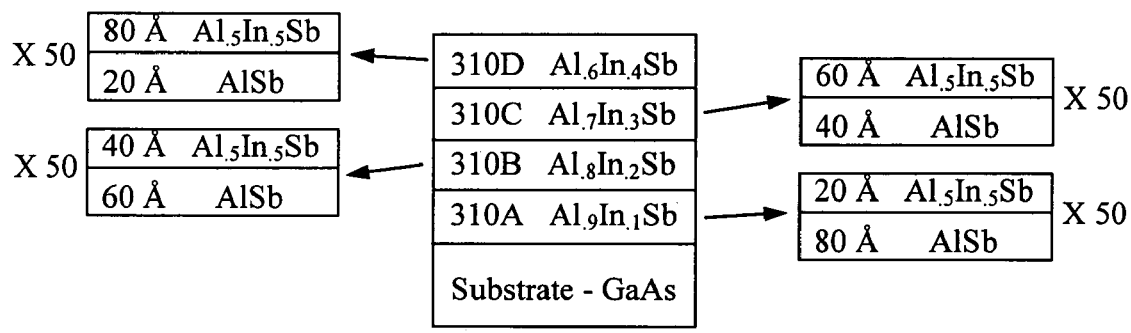
FIG. 3A
$$Al_{1-z}In_zSb = \begin{array}{|c|} \hline d_2 \; Al_{0.5}In_{0.5}Sb \\ \hline d_1 \; AlSb \\ \hline \end{array} \qquad z = \frac{d_2}{d_1 + d_2} 0.5$$
FIG. 3B

METAMORPHIC BUFFER ON SMALL LATTICE CONSTANT SUBSTRATES

CROSS-REFERENCE TO RELATED APPLICATION

This application claims priority under 35 U.S.C. § 119(e) to U.S. Provisional Patent Application Ser. No. 60/551,747, "Metamorphic antimonide semiconductor lasers," filed Mar. 10, 2004. The subject matter of the foregoing is incorporated herein by reference in its entirety.

GOVERNMENT RIGHTS

This invention was made with government support under Contract No. DAAD 19-01-2-0008 awarded by BAE Systems, Contract No. N00014-99-1-1023 awarded by the Office of Naval Research and Contract No. F49620-99-1-0330 awarded by the Air Force Office of Scientific Research. The government has rights in the invention.

BACKGROUND OF THE INVENTION

1. Field of the Invention

This invention relates generally to metamorphic buffers on small lattice constant substrates, for example AlInSb metamorphic buffer layers on Si, GaAs or InP substrates.

2. Description of the Related Art

Owing to the wide range of desirable electronic and optical properties of ternary, quaternary, and higher complexity semiconductor materials, there is an ongoing need to provide a suitable growth platform for semiconductor alloys for which no lattice matched substrate is readily available. Researchers and technologists have been quick to exploit the combinations of materials that have lattice constants close to those of readily available substrate materials. However, many interesting and potentially high performance device structures, including emitters, detectors, and high speed electronic devices, face fabrication challenges due to the lack of a suitable substrate on which to grow them.

For example, for III-V compound semiconductors, the substrates available in reasonable quantity with high metallurgical quality at affordable cost are limited to a few of the binary materials, including GaAs, InP, InAs, InSb, GaSb, and GaP. To date, no high quality substrates of any of the ternary III-V alloys are commercially available although many of these alloys are of interest for device structures. However, semiconductor devices in which the active region of the device is grown directly onto a lattice-mismatched substrate usually contain a large density of metallurgical (structural) defects, leading to poor device performance. Thus, if full advantage is to be taken of the wide range of electronic and optical properties of III-V alloys, a suitable growth platform is highly desirable.

Various attempts have been made to address this problem. For example, thin strained films (i.e., strained materials that have a different lattice constant than the substrate) can be grown up to thicknesses usually not exceeding 10-50 nm. However, devices often need thicker layers on the order of 1-10 micron. For these thicknesses, typical strains of 0.5 to 2% are extremely difficult, if not impossible, to accommodate in the crystal. The strain relaxes and dislocations and defects form that are generally deleterious to the device operation.

Another approach to achieving flexibility in the lattice constant of the "substrate" material is the use of appropriate metamorphic (strain-relaxed) buffer layers in various forms. These metamorphic layers are grown on a commercially available substrate in such a way that they relax to a lattice constant suitable for the epitaxial growth of the desired device structure. Ideally, one can in effect achieve a ternary (or quaternary or more complex) alloy substrate, not by bulk growth techniques, but by epitaxial growth processes. However, previous demonstrations of metamorphic buffer layers are typically on substrates that have a lattice mismatch of not more than 4% with respect to the desired device structure. For example, AlInSb metamorphic buffer layers have been demonstrated on GaSb substrates. However, the buffer layer contacting the GaSb substrate typically is an AlSb layer. The GaSb substrate has a lattice constant of 6.096 angstroms; the AlSb layer has a lattice constant of 6.136 angstroms. This represents a lattice mismatch of only 0.66% between the GaSb substrate and the AlSb layer.

It is generally accepted that it is difficult to change the lattice constant by significantly more than this within a short distance (e.g., typically 1-10 micron of material thickness) if an acceptable dislocation density is desired (e.g., typically below 100 million/cm). Unfortunately, many of the common substrates, including Si, GaAs and InP, will require a change in lattice constant of this magnitude. For example, for an active region that has a lattice constant of 6.1 angstroms, InP, GaAs and Si have lattice mismatches of approximately 3.9%, 7.9% and 12.3%, respectively. In contrast, the lattice constant of GaSb is approximately 6.1 angstroms, yielding only minimal mismatch if any. There is a marked lack of demonstrations of mismatches of more than 4%.

Thus, there is a need for a growth platform that is matched to the larger lattice constant of an active device but based on a smaller lattice constant substrate.

SUMMARY OF THE INVENTION

The present invention overcomes the limitations of the prior art by providing a metamorphic buffer on a small lattice constant substrate. A semiconductor device is supported by a substrate with a smaller lattice constant. A metamorphic buffer provides a transition from the smaller lattice constant of the substrate to the larger lattice constant of the semiconductor device.

In one application, the metamorphic buffer includes multiple layers, at least some of which contain Sb. The metamorphic buffer layer that interfaces to the semiconductor device has a lattice constant of between approximately 6.1 and 6.35 angstroms, which is matched to the lattice constant of the semiconductor device. In one application, the lattice constant of the substrate is more than 4% smaller than that of the semiconductor device. In another application, the lattice constant of the substrate is less than approximately 5.9 angstroms, compared to a lattice constant for the semiconductor device of greater than approximately 6.1 angstroms.

For many III-V applications, it is desirable for the semiconductor device to have an active region with a lattice constant in the 6.1-6.35 angstrom range. For example, the active region may be based on ternary or quaternary compounds where the constituent elements are selected from aluminum (Al), indium (In), arsenic (As), gallium (Ga), phosphorus (P) and antimony (Sb). For many of these applications, AlInSb metamorphic buffer layers are a preferred implementation. Substrate choices include commercially available Si, GaAs and InP.

In one design, the transition in lattice constant is achieved by altering the composition of the metamorphic buffer layers. For example, the buffer layers may be $Al_{1-x}In_xSb$ layers, where x varies from one value at the substrate interface to another value at the interface to the semiconductor device.

The lattice constant may vary in a continuous fashion, in a step-graded fashion, or otherwise. It is preferable for the lattice constant to vary monotonically. In one approach, this can be achieved by monotonically varying x in a corresponding fashion; each value of x is chosen to produce the corresponding desired lattice constant. In another approach, metamorphic buffer layers are based on digital alloy layers. For example, rather than implementing a metamorphic buffer layer that has a composition of $Al_{1-z}In_zSb$, a digital alloy with an $Al_{1-x}In_xSb$ sublayer and an $Al_{1-y}In_ySb$ sublayer, where z is between x and y, can be used instead. The effective lattice constant of the digital alloy depends on the relative thicknesses of the two (or more) sublayers, which thicknesses can be selected so that the effective lattice constant of the digital alloy matches that of the homogeneous material $Al_{1-z}In_zSb$. One advantage of digital alloys is that the effective lattice constant can be changed by varying the relative thicknesses of the sublayers, rather than by changing the material composition.

In an extension of this approach, the metamorphic buffer comprises two or more superlattice structures. Each superlattice structure is based on digital alloys. The composition of the sublayers in the digital alloys are the same throughout the superlattice structure but may vary from one superlattice structure to the next. In addition, the thicknesses of the sublayers may or may not vary throughout the superlattice structure. For example, a first superlattice structure may contain many digital alloy layers, each based on AlSb and $Al_{0.7}In_{0.3}Sb$ sublayers. The next superlattice structure may be based on $Al_{0.7}In_{0.3}Sb$ and $Al_{0.5}In_{0.5}Sb$ sublayers, and so on. Within the first superlattice structure, the thicknesses of the sublayers may be constant from one digital alloy layer to the next (i.e., the average lattice constant of the digital alloy is constant), or the relative thicknesses may vary from one digital alloy layer to the next (i.e., the average lattice constant varies, resulting in a continuous grade).

Antimonide metamorphic lasers are one example of an active device that can benefit from small lattice constant substrates and metamorphic buffers. In one particular implementation, the substrate is commercially available (e.g., GaAs) and the active region of the device has quantum confinement structures containing Sb (e.g., GaInSb quantum wells). AlInSb metamorphic buffer layers are used to transition from the small lattice constant substrate to the active device. These devices can be configured to be vertically emitting lasers or edge-emitting lasers. Various active region designs are possible. In one approach, As is added to the quantum confinement structures. As another example, the quantum confinement structures can include strain compensated quantum wells. Other variations will be apparent.

Other aspects of the invention include other designs and devices utilizing the same principles as described above, systems and applications for these devices, and methods for manufacturing these devices.

BRIEF DESCRIPTION OF THE DRAWINGS

The invention has other advantages and features which will be more readily apparent from the following detailed description of the invention and the appended claims, when taken in conjunction with the accompanying drawings, in which:

FIG. 2 is an illustration of an example metamorphic buffer according to the invention.

FIG. 3A is an illustration of a metamorphic buffer based on digital alloys.

FIG. 3B illustrates the effective lattice constant of a digital alloy.

DETAILED DESCRIPTION OF THE PREFERRED EMBODIMENTS

Figure 1:
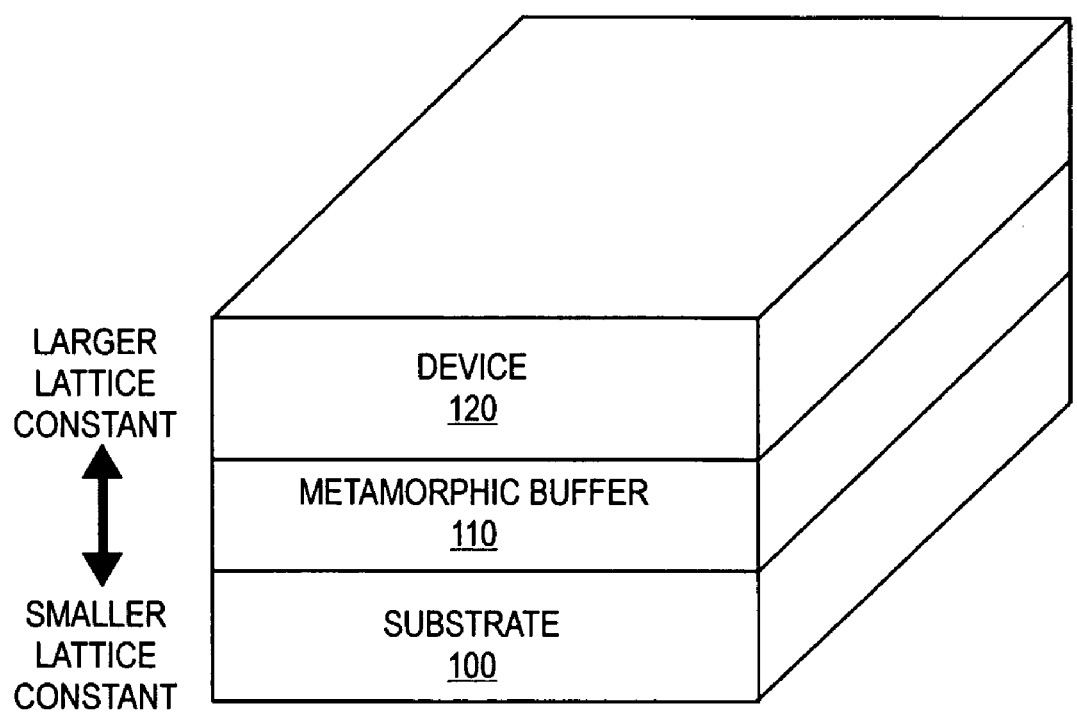
FIG. 1 is an illustration of a device disposed on a small lattice constant substrate according to the invention.

FIG. 1 is an illustration of a device 120 disposed on a small lattice constant substrate 100 according to the invention. A metamorphic buffer 10 facilitates the transition of lattice constant from the substrate 100 to the device 120. The substrate 100 is a "small" lattice constant substrate in the sense that the lattice constant of the substrate is small compared to the lattice constant of the device 120. In certain implementations, the small lattice constant substrate 100 has a lattice constant that is less than that of the device 120.

In one implementation, the metamorphic buffer 110 is constructed of layers that transition from the lattice constant of the substrate 100 to that of the device 120. More specifically, the layers of the metamorphic buffer 110 that interface to the substrate 100 have a lattice constant with the least amount of lattice mismatch to that of the substrate 100. Moving from the substrate 100 to the device 120, the composition of the metamorphic buffer layers is changed to alter the lattice constant to a larger value. The layer-to-layer transitions are designed to filter dislocations and to keep the surface of the metamorphic buffer smooth. For many current III-V applications, a surface which has less than 4 nm root-mean-squared roughness is usually sufficiently smooth. The uppermost layers of the metamorphic buffer 110 act as a "virtual substrate" and the lattice constant of these layers is the lattice constant to which the overlaying device 120 will interface.

The device 120 typically is a semiconductor device and could be either active or passive. It has a lattice constant that is substantially similar to that of the device interface layer of the metamorphic buffer 110 (i.e., the metamorphic buffer layer that interfaces to the device 120). The device 120 can contain various thin films that are strained (typically <20 nm for III-V optoelectronic devices) with respect to the lattice constant of the device interface layer of the metamorphic buffer, but the bulk of the device typically is lattice matched to the device interface layer. Examples of devices include transistors, amplifiers, light emitting devices, lasers, detectors, mirrors and circuits built from these components.

The substrate 100 is usually a wafer that is a single crystal with a thickness in the range of 100-500 μm or more and that provides a desired lattice constant, certain electrical and optical properties, and mechanical stability. The latter typically dictates the substrate thickness.

In one implementation, the device 120 is a III-V device. Many of these devices are approximately 0.25-15.0 μm tall or thick. Various material systems are preferred for these types of devices. Most such devices 120 are based on ternary or quaternary compounds where the constituent elements are selected from aluminum (Al), indium (In), arsenic (As), gallium (Ga), phosphorus (P) and antimony (Sb). Devices of this type frequently have pseudomorphic lattice constants that are in the range of 6.1-6.35 angstroms. In these cases, many commercially available substrates 100, such as Si, GaAs and InP, have significantly smaller lattice constants than the device 120.

One advantage of metamorphic buffer 110 is that it allows the use of these commercially available substrates with these III-V devices. Preferably, the layers within the metamorphic buffer 110 are also composed of mixtures of Al, In, As, Ga and/or Sb. AlInSb or other types of Sb-based buffer layers are generally preferred. Examples of other compounds include GaInAs, InAsSb and GaInSb. In many of these applications, the metamorphic buffer 110 preferably is 1.0-10.0 μm high.

Within the class of III-V devices, one range of lattice constants of particular interest is from that of GaSb to approximately half way to that of InSb, i.e., lattice constants corresponding to $Ga_{1-x}In_xSb$, for 0<x<0.5. This range of in-plane lattice constants, approximately 6.1-6.35 angstroms, provides a suitable growth platform for strained and unstrained heterostructure lasers using the desirable type I band offsets of the AlGaInSb/GaInSb interfaces. Combinations of the $Al_{1-x}In_xSb$ alloy system are well suited for use as the metamorphic buffer to match the lattice constant for these types of devices.

FIG. 2 is an illustration of an example metamorphic buffer according to the invention. Here, the substrate has a lattice constant of a1 and the device (not shown) has a lattice constant of a2. The metamorphic buffer transitions from a lattice constant of a1+Δa on the substrate side to a lattice constant of a2=a1+nΔa on the device side. The metamorphic buffer 110 is split into multiple layers 210A-210N, with the lattice constants of the layers increasing monotonically from a1 to a2. In the example of FIG. 2, each buffer layer 210 increases the lattice constant by a constant amount Δa. The number of layers (or, equivalently, the incremental lattice constant amount Δa), as well as other parameters of the layers 210 such as thickness, are selected to filter dislocations, achieve a smooth surface and according to whatever other requirements are dictated by the specific application.

Relaxation of the final material to the desired lattice constant results in the formation of many defects, usually primarily dislocations for material that is compressively strained ($a_2>a_1$). These defects, usually called threading dislocations, can propagate into the succeeding layers of the buffer and eventually into the active region of the device grown onto the buffer. Threading dislocations are the main source of poor device performance in lattice-mismatched structures. However, the strain within the buffer material exerts forces on these dislocations, causing a significant fraction of them to bend into planes perpendicular to the growth direction. This results in a decrease in the number of threading dislocations propagating through the buffer layers. This process is often referred to as dislocation filtering. This is particularly effective in the case of large local strains like those present near the abrupt interfaces between the different buffer layers 210 in structures like that of FIG. 2. The combination of dislocation bending and dislocation annihilation (i.e., direct interference of one dislocation with another) can result in a lower defect density at the device interface layer of the metamorphic buffer (i.e., the buffer layers that interface to the device). Lower defect density provides a more attractive growth platform for device 120.

The structure shown in FIG. 2 can be described as a step-graded metamorphic buffer. If s is taken as the growth direction (i.e., s varies as one moves from the substrate to the device), then the lattice constant is a piece-wise constant function of s, increasing in value at the transition from one buffer layer 210 to the next. Other metamorphic buffer designs are also possible. For example, the material composition of the metamorphic buffer can vary continuously as a function of x so that the lattice constant also varies continuously as a function of s (i.e., the lattice constant is a continuous function of s).

Fabrication of the structure literally shown in FIG. 2 typically requires the growth of numerous layers of different compositions. For the molecular beam epitaxy (MBE) growth process, this currently requires changes in one or more of the molecular fluxes for each of the individual layers 210 in the buffer structure. This could be implemented by using many different sources corresponding to the different layers 210. However, without numerous sources, flux changes require changes in the source temperatures for each layer 210. Changing source temperatures is time-consuming.

FIGS. 3A-3B are an illustration of a metamorphic buffer that overcomes this disadvantage. This example builds a virtual substrate on a GaAs substrate using AlInSb metamorphic buffer layers. As shown in FIG. 3A, the metamorphic buffer is built from a series of $Al_{1-x}In_xSb$ buffer layers 310A-310D, where x changes from one layer to the next. However, each buffer layer is not implemented as a homogeneous volume of $Al_{1-x}In_xSb$ material. Rather, each buffer layer is constructed using digital alloys that mimic the lattice constant of that buffer layer. A digital alloy is a series of thin sublayers of two (or more) materials whose average lattice constant match that of the single layer they replace. The composition and relative thickness of the sublayers are chosen to give the desired effective lattice constant. When a different effective lattice constant is needed, the relative thickness of the sublayers is changed. For the AlInSb alloy system, digital alloys composed of thin sublayers of $Al_{1-x}In_xSb$ and $Al_{1-y}In_ySb$ can be combined in the proper thickness ratio to obtain a combination whose effective lattice constant will match the actual lattice constant for homogeneous material $Al_{1-x}In_xSb$ for a wide range of values z between x and y. For MBE growth, if sources for only $Al_{1-x}In_xSb$ and $Al_{1-y}In_ySb$ (but not for all intermediate values of z) are provided, the change in relative thickness and corresponding change in effective lattice constant can be achieved relatively easily by changing the shuttering times for the sources.

FIG. 3B shows one model for calculating the effective lattice constant of a digital alloy, using an example where x=0 and y=0.5. In other words, the digital alloy consists of a thickness d1 of $Al_{1.0}In_0Sb$ (i.e., AlSb) and a thickness d2 of $Al_{0.5}In_{0.5}Sb$. The equivalent structure is modeled as $Al_{1-z}In_zSb$ where z can be approximated by the thickness-weighted average value, for example z=(x d1+y d2)/(d1+d2). The effective lattice constant of the digital alloy is modeled as equal to the lattice constant of $Al_{1-z}In_zSb$. The total thickness of the digital alloy layer, d1+d2, is preferably small, usually in the range of 25-100 angstroms for this application, so many digital alloy layers may be required to mimic the thicker homogeneous layer $Al_{1-z}In_zSb$.

Referring again to FIG. 3A, the homogeneous layer $Al_{0.9}In_{0.1}Sb$ is implemented as 50 layers of the digital alloy that has an 80 angstrom thick AlSb sublayer and a 20 angstrom thick $Al_{0.5}In_{0.5}Sb$ sublayer. The homogeneous layer $Al_{0.8}In_{0.2}Sb$ is implemented as 50 layers of the digital alloy that is 60 angstroms of AlSb and 40 angstroms of $Al_{0.5}In_{0.5}Sb$, etc.

The digital alloy approach has numerous advantages. It is convenient, accurate, and repeatable because it primarily involves the timing of shutters for the proper sources. In addition, the additional strain concentration at the many interfaces of the digital alloy is beneficial for both the generation of dislocations necessary to achieve complete relaxation, and the filtering of those dislocations by bending them in the strain fields of the interfaces. Digital alloy techniques have been used to produce metamorphic buffer structures whose terminating layer shows no threading dislocations in cross sectional TEM images.

Figure 4:
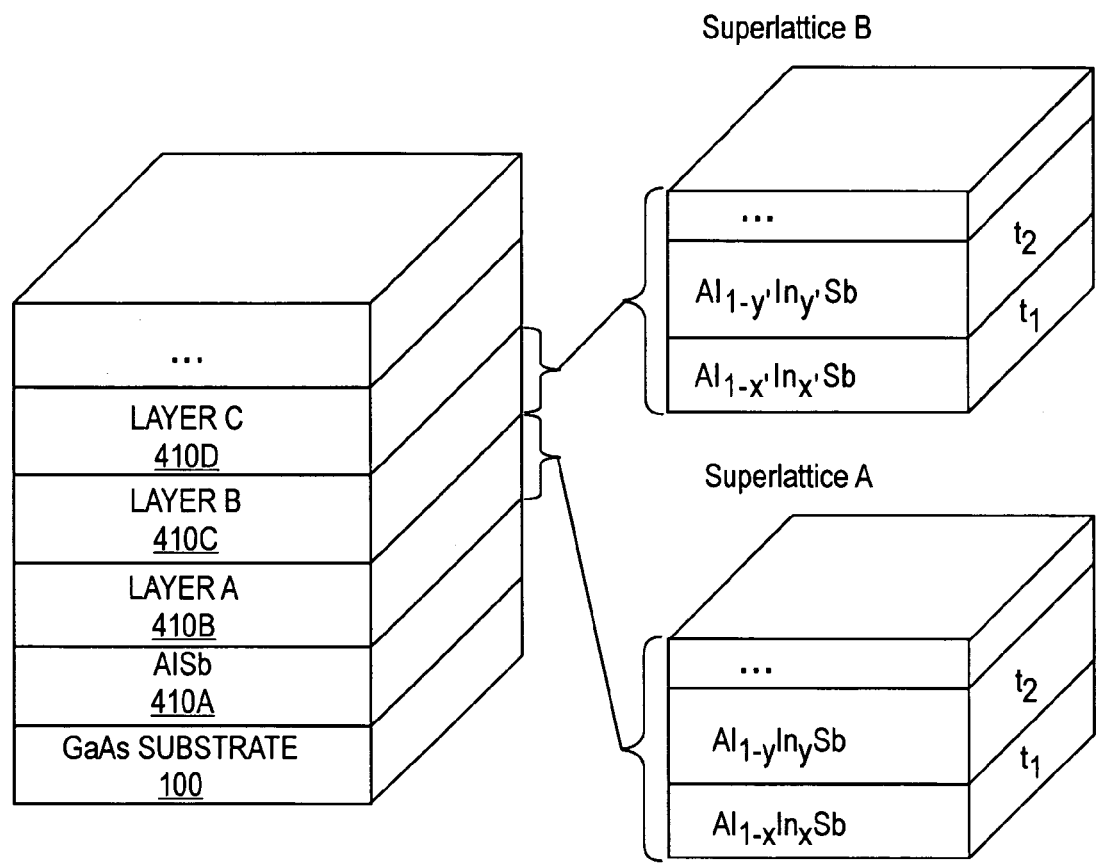
FIG. 4 is an illustration of a metamorphic buffer based on superlattices.

FIG. 4 shows an extension of the digital alloy concept where the metamorphic buffer is constructed from superlattices 410B-410N (layer 410A is a homogeneous AlSb layer). Each superlattice layer 410 is a series of digital alloy layers constructed from $Al_{1-x}In_xSb$ and $Al_{1-y}In_ySb$ sublayers. The values of x and y are constant within one superlattice but may change from one superlattice to the next. Thus, superlattice 410B may be based on sublayers with x=0.0 and y=0.3, superlattice 410C may be based on sublayers with x'=0.3 and y'=0.5, etc. Within a superlattice, the thickness of each sublayer within a digital alloy may or may not change. For example, superlattice 410B is constructed from many digital alloy layers having an AlSb sublayer with thickness t1 and an $Al_{0.7}In_{0.3}Sb$ sublayer with thickness t2. The thicknesses t1 and t2 may be constant for all digital alloy layers in the superlattice, in which case the effective lattice constant is constant across the superlattice. Alternately, the thicknesses t1 and t2 may vary from one end of the superlattice to the other, for example to approximate a continuously graded lattice constant.

As a simple example, assume that there are N superlattices, each superlattice has M digital alloy layers, and each digital alloy layer has thickness P (i.e., P=t1+t2). Then the total thickness of the metamorphic buffer (or at least the part constructed from these superlattices) is given by N×M×P. For the AlInSb examples discussed previously, the thickness P of each digital alloy layer preferably is in the range 20-300 angstroms and the thickness of each superlattice preferably is in the range of 0.5-5.0 µm. N represents the number of superlattices, which is also the number of x,y material compositions that need be implemented. If N is small, then the number of sources is reduced and more of the grading of the lattice constant can be achieved by changing the shuttering times for the sources. However, a small N typically implies that the values of x and y will be further apart, thus introducing a greater lattice mismatch between the sublayers of the digital alloy.

Other materials available for digital alloys in this general lattice constant range are $Ga_{1-x}In_xSb$ and $InAs_{1-x}Sb_x$. The $Al_{1-x}In_xSb$ system is preferred due to the wider range of melting points in this alloy system, permitting a wider range of MBE growth temperature. These techniques can also be extended to other alloys, such as those involving bismuth or thallium, especially if the technology for their growth is improved. Similar results may be achieved using combinations of the cubic II-VI materials, such as CdTe, ZnSe, and CdS.

The metamorphic buffer structures described above can be used as the growth platform for quantum well laser structures using AlGaInSb for the barrier and waveguide materials and GaInSb for the well material. A small amount of As can be added to the well material. With proper control of the As level in GaInAsSb, the operational wavelength typically can be increased without losing the type I band offset.

Figure 5:
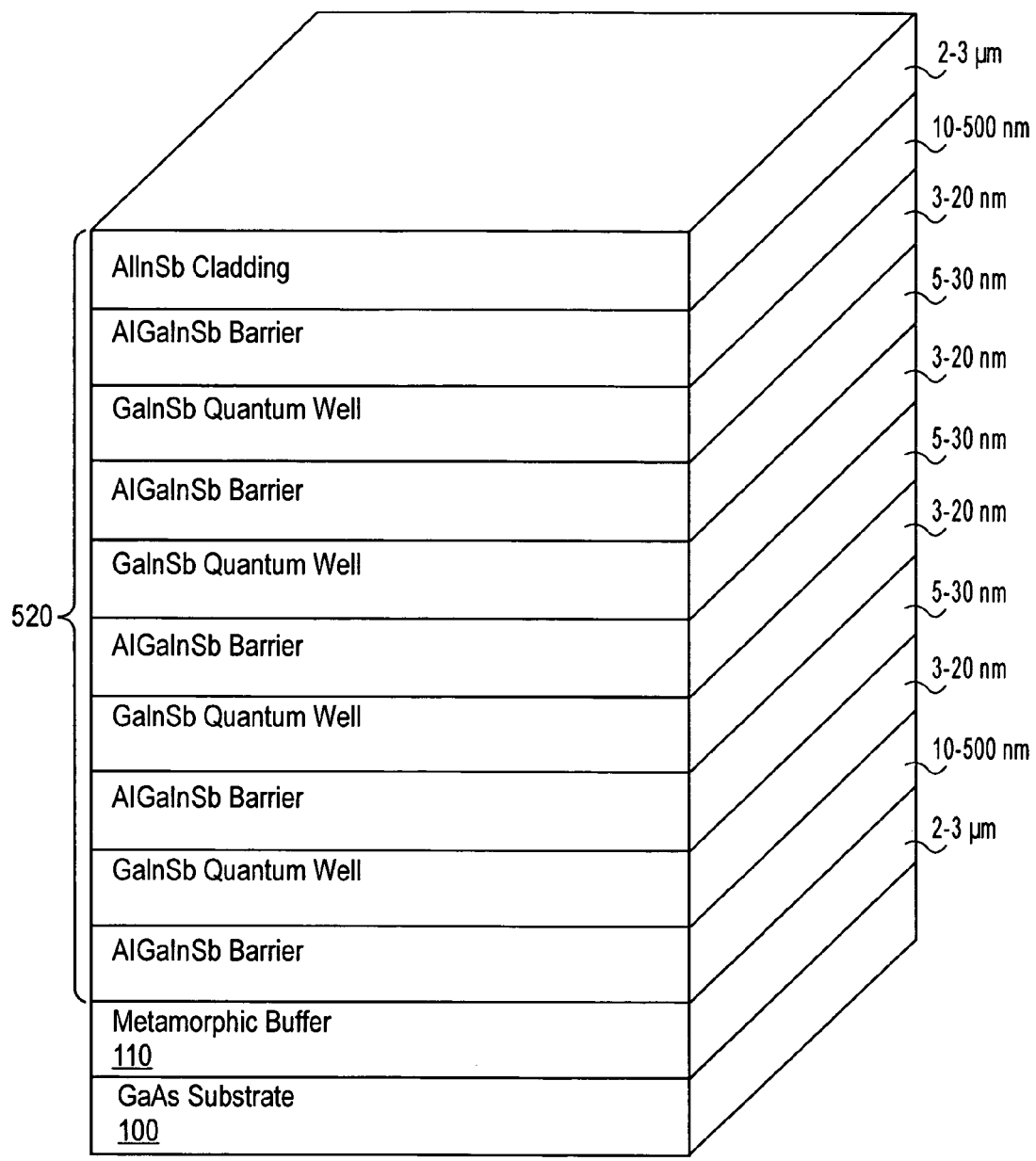
FIGS. 5-7 are illustrations of antimonide metamorphic lasers according to the invention.

FIG. 5 is an illustration of an antimonide metamorphic laser according to the invention. This example uses a GaAs substrate 100, AlInSb buffer layer 110, and the active device 520 is based on GaInSb quantum wells. This structure could also be used as the basis for LEDs or photodetectors. This structure is an example of an active device 520 disposed on top of the virtual substrate consisting of a metamorphic buffer 110 and a commercially available substrate 100. The wavelength range of operation for this laser device includes wavelengths longer than 2.7 µm, but principally from 2.7-7.0 µm.

The light is generated in the GaInSb quantum wells. These quantum wells efficiently trap electrons and holes that recombine to form the emitted light. This particular example shows four quantum wells, although other numbers and/or types of quantum wells are also possible. In a preferred embodiment, the number of quantum wells ranges from one to ten. The AlInSb upper cladding layer and the metamorphic buffer combined with the AlGaInSb barriers form an optical waveguide.

In one approach, the laser structure is electrically pumped, for example by doping the structure to form a laser diode. For example, the upper and lower AlInSb cladding layers could be doped p- and n-type, respectively. The metamorphic buffer 110 and the GaSb substrate 100 could be doped n-type. Alternately, the laser structure could be optically pumped, for example by another laser of shorter wavelength than the AlGaInSb barrier layer. In this case, the layers are preferably left undoped. FIG. 5 shows typical thicknesses for the various layers.

Figure 6:
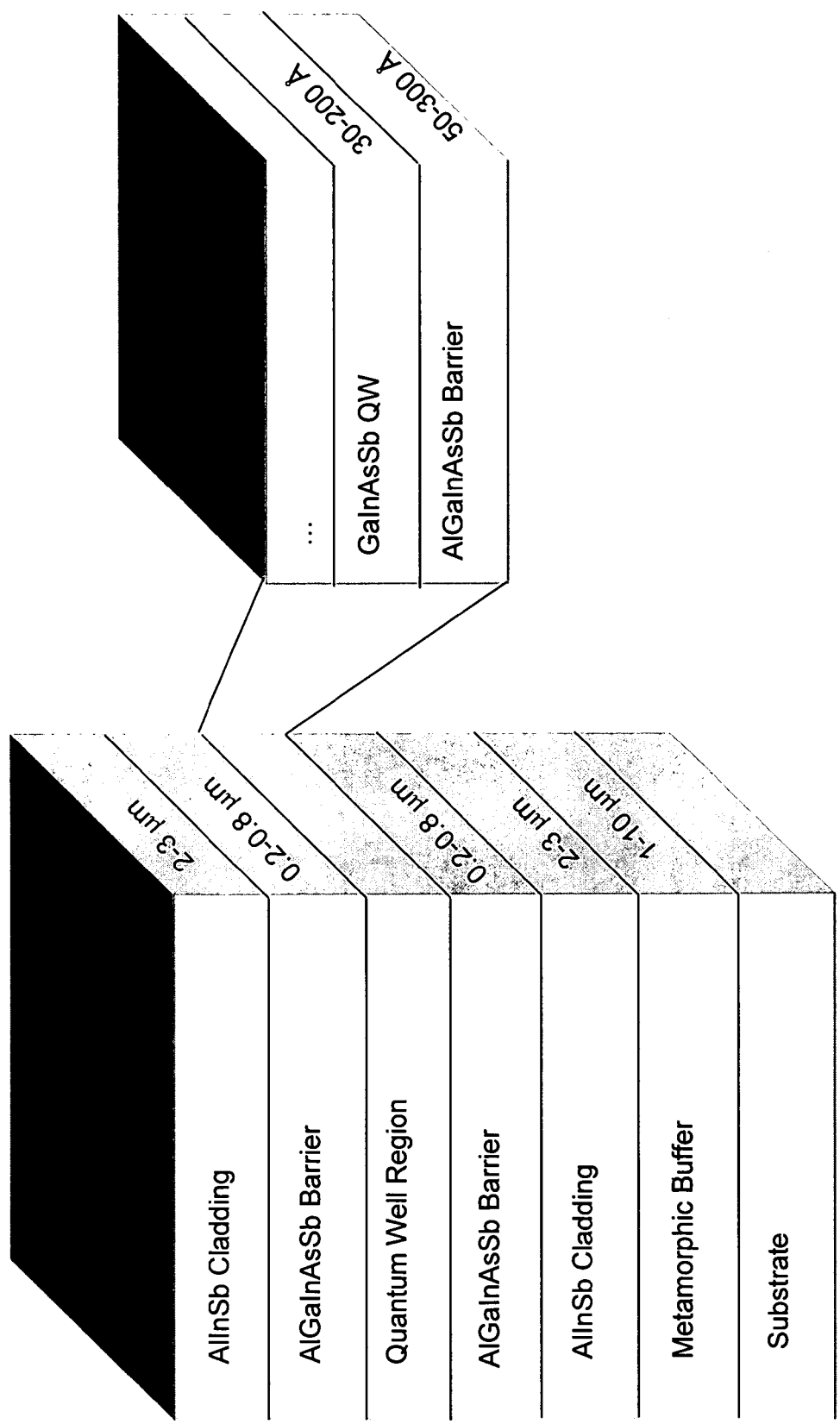

FIG. 6 shows another antimonide metamorphic laser. This diagram shows the addition of arsenic to the laser structure of FIG. 5. in order to modify the device characteristics. Adding small amounts of As can enhance or modify device characteristics such as threshold power, wavelength of emission, efficiency, beam divergence, temperature performance, or beam quality.

Figure 7:
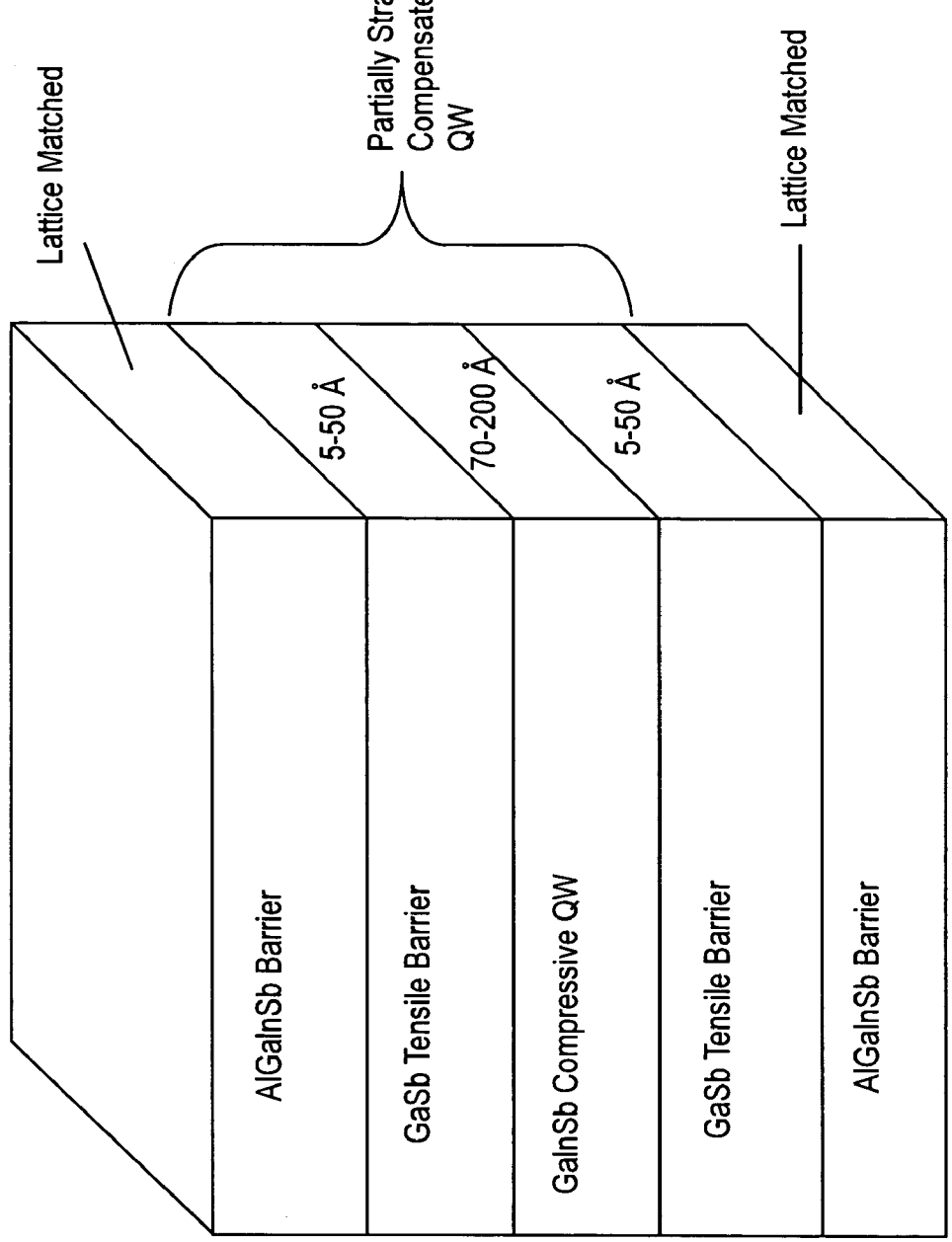

FIG. 7 shows another variant of the AlGaInSb/GaInSb multiple quantum well laser structure of FIG. 5. FIG. 7 shows just the layers between the two barrier layers. Thin GaSb layers positioned around the GaInSb quantum well can help reduce the deleterious effects of accumulated compressive strain. The strain compensation is used to make sure that the strain in the device is not so excessive that dislocations are formed.

Although the detailed description contains many specifics, these should not be construed as limiting the scope of the invention but merely as illustrating different examples and aspects of the invention. It should be appreciated that the scope of the invention includes other embodiments not discussed in detail above. For example, the descriptions above have focused on the one-dimensional design of devices—i.e., the different layers. The lateral shape of these layers will be determined by the specific application according to well-known principles. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A metamorphic semiconductor device comprising:
    a substrate;
    a semiconductor device supported by the substrate; and
    metamorphic buffer layers between the substrate and the semiconductor device, at least some of the metamorphic buffer layers forming two or more superlattice structures, wherein
    each superlattice structure comprises digital alloy layers and all of the digital alloy layers within each superlattice structure comprise an $Al_{1-x}In_xSb$ sublayer and an $Al_{1-y}In_ySb$ sublayer with x≠y;
    within a superlattice structure of the superlattice structures, the thicknesses of the $Al_{1-x}In_xSb$ sublayer and the $Al_{1-y}In_ySb$ sublayer vary monotonically across the superlattice structure; and
    the substrate has a first lattice constant, a device interface layer of the metamorphic buffer layers has a second lattice constant of between approximately 6.1 and 6.35 angstroms that is matched to a lattice constant of the semiconductor device, and the first lattice constant is significantly smaller than the second lattice constant.

2. The metamorphic semiconductor device of claim 1 wherein the substrate is a Si substrate, a GaAs substrate or an InP substrate.

3. The metamorphic semiconductor device of claim 1 wherein an interface layer to the substrate includes an AlSb metamorphic buffer layer.

4. The metamorphic semiconductor device of claim 1 wherein the values of x and y are constant within each superlattice structure but vary monotonically between superlattice structures.

5. The metamorphic semiconductor device of claim 1 wherein the metamorphic buffer layers have lattice constants that are step graded between the first lattice constant and the second lattice constant.

6. The metamorphic semiconductor device of claim 1 wherein the metamorphic buffer layers have lattice constants that are continuously graded over a range between the first lattice constant and the second lattice constant.

7. The metamorphic semiconductor device of claim 1 wherein the semiconductor device supported by the substrate comprises:
an active region having quantum confinement structures containing Sb.

8. The metamorphic semiconductor device of claim 7 wherein the semiconductor device supported by the substrate comprises an antimonide metamorphic laser.

9. The metamorphic semiconductor device of claim 7 wherein the semiconductor device supported by the substrate comprises a vertically emitting laser, the active region providing optical gain for the vertically emitting laser.

10. The metamorphic semiconductor device of claim 7 wherein the quantum confinement structures also containing As.

11. The metamorphic semiconductor device of claim 7 wherein the quantum confinement structures include strain compensated quantum wells.

12. The metamorphic semiconductor device of claim 7 wherein the quantum confinement structures include GaInSb quantum wells.

13. A metamorphic semiconductor device comprising:
a substrate;
a semiconductor device supported by the substrate; and
a metamorphic buffer between the substrate and the semiconductor device, the metamorphic buffer comprising superlattice structures, wherein
each superlattice structure comprises digital alloy layers and all of the digital alloy layers within each superlattice structure comprise an $Al_{1-x}In_xSb$ sublayer and an $Al_{1-y}In_ySb$ sublayer with $x \neq y$;
within a superlattice structure of the superlattice structures, the thicknesses of the $Al_{1-x}In_xSb$ sublayer and the $Al_{1-y}In_ySb$ sublayer vary monotonically across the superlattice structure; and
the substrate has a first lattice constant, a device interface layer of the metamorphic buffer has a second lattice constant matched to a lattice constant of the semiconductor device, and the first lattice constant is significantly smaller than the second lattice constant.

14. The metamorphic semiconductor device of claim 13 wherein the second lattice constant is between approximately 6.1 and 6.35 angstroms.

15. A metamorphic semiconductor device comprising:
a substrate;
a semiconductor device supported by the substrate; and
metamorphic buffer layers between the substrate and the semiconductor device, at least some of the metamorphic buffer layers forming two or more superlattice structures, wherein
each superlattice structure comprises digital alloy layers and each digital alloy layer comprises an $Al_{1-x}In_xSb$ sublayer and an $Al_{1-y}In_ySb$ sublayer with $x \neq y$;
relative thicknesses of the sublayers of the digital alloy layers in each superlattice structure vary monotonically between the superlattice structures; and
the substrate has a first lattice constant, a device interface layer of the metamorphic buffer layers has a second lattice constant matched to a lattice constant of the semiconductor device, and the first lattice constant is significantly smaller than the second lattice constant.

16. The metamorphic semiconductor device of claim 15 wherein the second lattice constant is between approximately 6.1 and 6.35 angstroms.

17. The metamorphic semiconductor device of claim 15, wherein the values of x and y are constant for all of the digital alloy layers.

18. The metamorphic semiconductor device of claim 15, wherein relative thicknesses of the $Al_{1-x}In_xSb$ sublayer and the $Al_{1-y}In_ySb$ sublayer of the digital alloy layers within each superlattice structure are constant.

19. The metamorphic semiconductor device of claim 18, wherein the metamorphic buffer layers have lattice constants that are step graded between the first lattice constant and the second lattice constant.

20. The metamorphic semiconductor device of claim 18, wherein the metamorphic buffer layers have lattice constants that are continuously graded over a range between the first lattice constant and the second lattice constant.

21. The metamorphic semiconductor device of claim 15, wherein the semiconductor device supported by the substrate comprises:
an active region having quantum confinement structures containing Sb.

22. The metamorphic semiconductor device of claim 21 wherein the semiconductor device supported by the substrate comprises a vertically emitting laser, and the active region provides optical gain for the vertically emitting laser.

23. The metamorphic semiconductor device of claim 21, wherein the quantum confinement structures include strain compensated quantum wells.

* * * * *

UNITED STATES PATENT AND TRADEMARK OFFICE
CERTIFICATE OF CORRECTION

PATENT NO.       : 7,633,083 B2
APPLICATION NO.  : 11/078642
DATED            : December 15, 2009
INVENTOR(S)      : Lester et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 698 days.

Signed and Sealed this

Twenty-first Day of December, 2010

David J. Kappos
*Director of the United States Patent and Trademark Office*